United States Patent
Trouve et al.

(10) Patent No.: US 10,096,113 B2
(45) Date of Patent: Oct. 9, 2018

(54) METHOD FOR DESIGNING A PASSIVE SINGLE-CHANNEL IMAGER CAPABLE OF ESTIMATING DEPTH OF FIELD

(71) Applicant: Office National D'Etudes et de Recherches Aerospatiales (ONERA), Chatillon (FR)

(72) Inventors: Pauline Trouve, Palaiseau (FR); Frederic Champagnat, Saint Mande (FR); Guy Le Besnerais, Cachan (FR); Guillaume Druart, Palaiseau (FR)

(73) Assignee: OFFICE NATIONAL D'ETUDES ET DE RECHERCHES AEROSPATIALES (ONERA), Chatillon (FR)

( * ) Notice: Subject to any disclaimer, the term of this patent is extended or adjusted under 35 U.S.C. 154(b) by 620 days.

(21) Appl. No.: 14/436,400

(22) PCT Filed: Oct. 9, 2013

(86) PCT No.: PCT/FR2013/000267
§ 371 (c)(1),
(2) Date: Apr. 16, 2015

(87) PCT Pub. No.: WO2014/060657
PCT Pub. Date: Apr. 24, 2014

(65) Prior Publication Data
US 2015/0302573 A1     Oct. 22, 2015

(30) Foreign Application Priority Data
Oct. 17, 2012  (FR) ..................... 12 02774

(51) Int. Cl.
G02B 27/00 (2006.01)
G06F 17/50 (2006.01)
(Continued)

(52) U.S. Cl.
CPC .......... G06T 7/004 (2013.01); G02B 27/0075 (2013.01); G06T 7/70 (2017.01);
(Continued)

(58) Field of Classification Search
None
See application file for complete search history.

(56) References Cited

U.S. PATENT DOCUMENTS 5,552,995 A * 9/1996 Sebastian ............ B29C 33/3835
700/182
6,329,989 B1 * 12/2001 Qi ........................... G06T 15/00
345/428
(Continued)

FOREIGN PATENT DOCUMENTS

| CN | 101236294 A | 8/2008 |
| CN | 101771893 A | 7/2010 |

(Continued)

OTHER PUBLICATIONS

International Search Report for International Application No. PCT/FR2013/000267 dated Nov. 22, 2013, 3 pages.
(Continued)

*Primary Examiner* — William C Vaughn, Jr.
*Assistant Examiner* — Lindsay Uhl
(74) *Attorney, Agent, or Firm* — TraskBritt

(57) ABSTRACT

A computer-implemented method for designing an electro-optical imaging system for estimating the distance of a source includes use of an optical subsystem, a detector subsystem and a digital image processing subsystem. The method includes the modelling of the propagation of radiation from its source through the optical subsystem, the detector subsystem and the digital image processing subsystem; the modelling being based on a spatial model of the source; the method including a joint step of simultaneously
(Continued)

designing the optical subsystem and the digital image processing subsystem, the designing step being based at least on one performance metric depending on a comparison between the local estimation of the distance from the source and the actual distance from the source.

18 Claims, 8 Drawing Sheets

(51) Int. Cl.
    *G06T 7/00*         (2017.01)
    *H04N 5/225*      (2006.01)
    *H04N 5/232*      (2006.01)
    *G06T 7/70*         (2017.01)

(52) U.S. Cl.
    CPC ....... *H04N 5/2258* (2013.01); *H04N 5/23229* (2013.01); *G06F 17/50* (2013.01); *G06T 2207/10016* (2013.01); *G06T 2207/20228* (2013.01)

(56) References Cited

U.S. PATENT DOCUMENTS

| | | | |
|---|---|---|---|
| 7,711,201 B2 | 5/2010 | Wong et al. | |
| 2005/0197809 A1* | 9/2005 | Dowski, Jr. | G02B 27/0012 703/6 |
| 2009/0141140 A1* | 6/2009 | Robinson | G02B 13/0025 348/222.1 |
| 2009/0268985 A1 | 10/2009 | Wong et al. | |
| 2011/0267486 A1 | 11/2011 | Kane et al. | |
| 2012/0224029 A1* | 9/2012 | Pavani | H04N 13/0217 348/47 |

FOREIGN PATENT DOCUMENTS

| | | |
|---|---|---|
| EP | 1734746 A1 | 12/2006 |
| FR | 2880958 A1 | 7/2006 |
| FR | 2919732 A1 | 2/2009 |
| JP | 03044609 A | 2/1991 |
| JP | 2010169503 A | 8/2010 |
| WO | 2007022329 A2 | 2/2007 |
| WO | 2009082822 A1 | 7/2009 |

OTHER PUBLICATIONS

Levin et al., Image and Depth from a Conventional Camera with a Coded Aperture, ACM Transactions on Graphics, vol. 26, No. 3, Article 70, (Jul. 2007), pp. 70-1-70-9.
Rajagopalan et al., Performance Analysis of Maximum Likelihood Estimator for Recovery of Depth from Defocused Images and Optimal Selection of Camera Parameters, International Journal of Computer Vision, vol. 30, No. 3, (1998), pp. 175-190.
Gross et al., Handbook of optical systems, Wiley-VCH, vol. 4 Survey of Optical Instruments, (2008), Chapter 39, pp. 253-390.
Gross et al, Handbook of optical systems, Wiley-VCH, vol. 4 Survey of Optical Instruments, (2008), Chapter 40, pp. 391-443.
Chinese First Office Action for Chinese Application No. 201380054478.6 dated Jul. 20, 2016, 11 pages.
Chinese Second Office Action for Chinese Application No. 201380054478.6 dated Nov. 2, 2016, 8 pages.
Chinese Third Office Action for Chinese Application No. 201380054478.6 dated Apr. 26, 2017, 10 pages.
Chinese Search Report for Chinese Application No. 201380054478.6 dated Jul. 12, 2016, 1 pages.
International Preliminary Report on Patentability for International Application No. PCT/FR2013/000267 dated Oct. 24, 2014, 10 pages.
International Written Opinion for International Application No. PCT/FR2013/000267 dated Nov. 22, 2013, 6 pages.
Japanese Office Action for Japanese Application No. 2015537318 dated Aug. 8, 2017, 6 pages.

* cited by examiner

| Surf:Type | Comment | Radius | Thickness | Glass | Semi-Diameter | Conic |
|---|---|---|---|---|---|---|
| OBJ Standard | | Infinity | 3000.000 | | 1027.477 | 0.000 |
| 1 Standard | | 25.502 | 7.000 | | 13.642 | 0.000 |
| 2 Standard | | 74.904 | 4.039 | N-LAK33A S | 11.975 | 0.000 |
| 3 Standard | | 13.208 | 7.026 | | 8.139 | 0.000 |
| 4 Standard | | 5.245 | 4.851 | N-SF66 S | 7.887 | 0.000 |
| STO Standard | | Infinity | 4.241 | | 2.552 | 0.000 |
| 6 Standard | | -56.255 | 7.000 | N-FK51A S | 4.886 | 0.000 |
| 7 Standard | | -8.349 | 9.702 | | 6.505 | -0.399 |
| 8 Standard | | 19.291 | 7.000 | N-FK51A S | 0.013 | 0.000 |
| 9 Standard | | -76.449 | 9.845 | | 8.499 | 0.000 |
| IMA Standard | | Infinity | — | | 7.800 | 0.000 |

FIG. 7

METHOD FOR DESIGNING A PASSIVE SINGLE-CHANNEL IMAGER CAPABLE OF ESTIMATING DEPTH OF FIELD

CROSS-REFERENCE TO RELATED APPLICATIONS

This application is a national phase entry under 35 U.S.C. § 371 of International Patent Application PCT/FR2013/000267, filed Oct. 9, 2013, designating the United States of America and published as International Patent Publication WO 2014/060657 A1 on Apr. 24, 2014, which claims the benefit under Article 8 of the Patent Cooperation Treaty and under 35 U.S.C. § 119(e) to French Patent Application Serial No. 12/02774, filed Oct. 17, 2012, the disclosure of each of which is hereby incorporated herein in its entirety by this reference.

TECHNICAL FIELD

The present disclosure relates to the field of the estimation of depth using an electro-optical passive single-channel system and, more specifically, the methods for designing such an electro-optical system.

BACKGROUND

The applications of such electro-optical systems more particularly relate to the field of defense where the development of autonomous devices such as drones, has required the development of 3D information extraction techniques on the environment of these devices.

Besides the new features associated with consumer technologies such as smart mobile phones or interactive gaming consoles, more and more often they use knowledge of the 3D environment around the user.

In both fields of application, the constraints specific to embedded systems require the designing of compact systems consuming little energy.

All mentioned devices have in common that they integrate at least one passive electro-optical system (a camera).

The object of the disclosure relates to the passive estimation of depth by exploiting data provided by the electro-optical system only, which is the least energy- and space-consuming method to add a 3D capacity to the device.

Single-channel distance estimation methods are known in the prior art.

U.S. Pat. No. 7,711,201 discloses a method and an electro-optical system for generating a depth map using a movable lens, an image sensor and a processing module coupled to the image sensor to determine the depth information. The lens, the image sensor and the processing module form an imaging device, such as a camera, used to capture an image of a scene for applications such as autofocusing, surveillance or autonomous vehicle navigation. A depth information calculation method includes a step of simulating a quantity of Gaussian blur using a convolution kernel, then an estimation of the difference of blur between the images.

The article by A. Levin, R. Fergus, F. Durand and W. T. Freeman, "Image and depth from a conventional camera with a coded aperture ACM Transactions on Graphics," SIGGRAPH 2007 (available online at groups.csail.mitedu/graphics/CodedAperture/CodedAperture-LevinEtAl-SIGGRAPH07.pdf) describes a solution wherein distance is estimated from a single-channel electro-optical system implementing a coded diaphragm. It also describes a method for optimizing the encoding of such diaphragm.

French Patent FR2880958 discloses an electro-optical system for increasing the depth of field. One of the alternative solutions described in this patent relates to the implementation of a method and a system adapted for measuring the distance of objects in a scene from a single acquisition without requiring optical ranging equipment. The method then makes it possible to obtain an estimation of the distance of objects present in each region of the digital image.

The solution provided in this document of the prior art consists in using chromatic optics, which makes it possible to have a variable level of sharpness depending on the red, green and blue channels of the acquisition, and to break up the digital image into X by Y pixel zones. For each zone, the sharpness of at least two channels is then measured, and the measured values or the relative measured values are then reported onto sharpness vs. distance curves, i.e., curves defined, for example, by calibrating the capture device. A distance corresponding to an estimation of the depth of the part of the object shown in the capture device area in the reference mark of the device is then obtained.

This method then makes it possible to obtain an estimation of the distance of the objects present in each region of the digital image in order to build a real-time and low-cost optical ranging device with a sensor and standard optics, which gives an image and distance information correlated with the image.

The international application WO2009/082822 is also known, which describes a method for generating a depth map using a single camera, while selecting the best focus metric among the focus metric information from a set of captured images. The best metric makes it possible to determine the optimal lens position and to deduce the depth therefrom. This method of the prior art uses the depth map generated to execute an image processing operation, allowing, for example, adjusting the intensity of the flash, to re-focus the image on a depth plane of interest or to help generate a color image.

The international application WO2007/022329 describes another example of an image acquisition system generating a depth map from two images of a three-dimensional spatial scene based on the relative blur between the two images and the absolute blur produced by the system, calculating the depth map directly from the relative blur between the two images and calculating a distance from the associated blur radius value.

The U.S. patent application Ser. No. 2009/268985, filed Apr. 29, 2008, now U.S. Pat. 8,280,194, describes an imaging system that generates a picture depth map from a pair of reduced resolution images, computing a blur difference between the two reduced resolution images at different image locations and calculating the depth map based on the blur difference between the two reduced resolution images at different image locations.

European issued patent EP1734746 is also known, which describes a method for optimizing an electro-optical system based on a performance criterion for the image quality. This patent specifically describes a computer method for designing an electro-optical imaging system consisting of:
  optical components;
  an electro-optical detector and associated circuitry; and
  digital processing means.

This method of the prior art is based on a spatial model of the source. The method includes steps of jointly designing together, rather than sequentially, optical subsystems and digital image processing subsystems, based on a post-pro cessing performance metric that depends on a comparison of a digital image calculated by the imaging system by the modelling with an ideal digital image of the source.

The article by A. Rajagopalan and S. Chaudhuri, "Performance analysis of maximum likelihood estimator for recovery of depth from defocused image and optimal selection of camera parameters," International Journal of Computer Vision, Springer, 1998, 30, p. 175-190 is also known, which presents a method for optimizing the blur ratio of two images used to estimate the depth. This optimization is based on a depth estimation performance criterion, which is the Cramer-Rao bound calculated using a blur modelling by a Gaussian function and a parametric model of the source.

DRAWBACKS OF THE PRIOR ART SOLUTIONS

The various solutions known in the prior art do not make it possible to optimize the single-channel electro-optical system according to the characteristics of the optical, detectors and image processing sub-assemblies for the estimation of the depth.

In particular, the solution proposed in the article by A. Levin provides an optimization of the diaphragm encoding from a criterion that gives no information on the accuracy of the depth estimation obtained; besides which, the optimization only relates to the diaphragm and not to the entire optical system.

French Patent FR2919732 takes into account a variation of the chromatic aberration, but the effect on the precision of the depth estimation is not described.

European Patent EP1734746 discloses a method for optimizing that does not make it possible to improve the precision of the distance estimation, but only the quality of the image.

The solution provided in the article by A. Rajagopalan does not make it possible to optimize an electro-optical system with an encoded diaphragm because this type of optical system does not meet the Gaussian blur hypothesis. In addition, it only allows an optimization of an electro-optical multi-channel system or possibly an electro-optical single-channel system with a sequential acquisition mode, in order to obtain several acquisitions of the same scene.

In summary, the solutions of the prior art do not make it possible to optimize an electro-optical system, based on the degree of precision of the depth estimation and the image acquisition conditions, for an electro-optical single-channel system.

BRIEF SUMMARY

The present disclosure aims at remedying the drawbacks of the prior art by providing a method for optimizing an electro-optical system, making it possible to improve the precision of the estimation of the distance of the source by taking into account the conditions of acquisition of the scene.

The aim is to take into account the estimation of the depth as from the designing of the electro-optical system, in order to optimize and ensure the performance, according to the user's needs.

The disclosure provides for a new method for designing an electro-optical passive single-channel system capable of estimating the depth, with an adaptation to the user's needs relating to estimation precision and conditions of use.

For this purpose, the disclosure in its broadest sense relates to a computer-implemented method for designing an electro-optical imaging system to estimate the distance of a source, including an optical subsystem, a detector subsystem and a digital image processing subsystem, the method including the modelling of the propagation of radiation from the source through the optical subsystem, the detector subsystem and the digital image processing subsystem, the modelling being based on a spatial model of the source, the method including a joint step of simultaneously designing the optical subsystem and the digital image processing system. The designing step is based at least on one performance metric depending on a comparison between the local estimate of the distance from the source and the actual distance from the source.

As used in this patent, the terms of "depth" and "distance" have the same technical meaning.

Preferably, depth is the distance measured along the optical axis between:
  the intersection between the optical axis and the orthogonal plane passing through the source, and
  the intersection between the optical axis and the entrance pupil, or any reference point of the camera.

Preferably, distance is measured or estimated between a source point and a point of arrival. The source point corresponds to the coordinates of a point source. A collection of point sources may form an extended source. If we take the barycenter of the collection of point sources, the point of arrival is, in particular, the center point of the entrance pupil, or any other reference point of the camera.

Field of Application

The disclosure applies when an image with a unique focus is acquired but also when conducting a simultaneous acquisition with different focuses, and processing a plurality of images.

Advantageously, the plurality of images is obtained with a detector consisting of a plurality of detector matrices, with each one being sensitive to a specific spectral band, with each image corresponding to one of the spectral bands.

According to a particular embodiment, the electro-optical system is provided with means for adjusting a specific focus for each one of the spectral bands.

According to one particular alternative embodiment, the optical subsystem includes an encoded diaphragm capable of minimizing the discrepancy between the estimated distance and the actual distance in a catalog of images, with the method comprising the steps of varying the encoding of the diaphragm and determining the discrepancy resulting therefrom.

According to one particular alternative embodiment, the metric characterizing the precision of the depth estimation can be associated with another metric, for example, a metric characterizing the sharpness or the ability to produce an image having a large depth of field.

BRIEF DESCRIPTION OF THE DRAWINGS

The present invention will be better understood upon reading the detailed description of an exemplary non-restrictive embodiment that follows, while referring to the accompanying drawings, wherein:

FIG. 7 shows a table of the characteristics of the lenses of the electro-optical system shown in FIG. 6.

DETAILED DESCRIPTION

Figure 1:
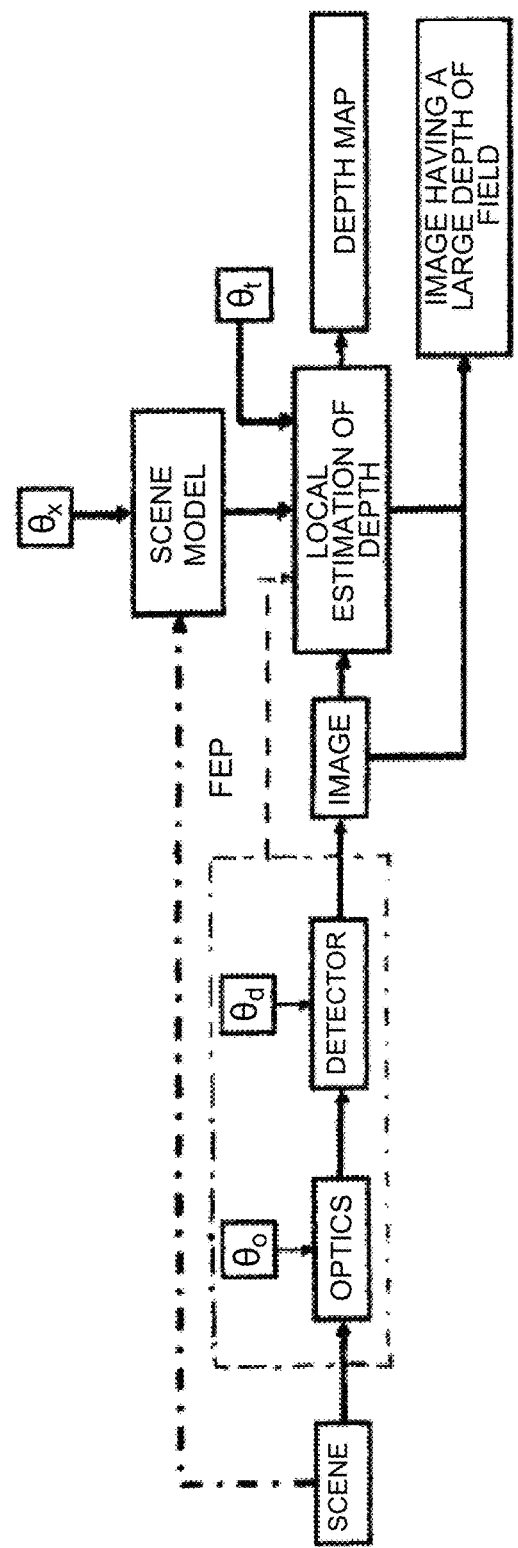
FIG. 1 shows the schematic diagram of the various functional blocks of an electro-optical passive single-channel system estimating the depth according to the state of the art.

FIG. 1 shows the schematic diagram of the various functional blocks of an electro-optical passive single-channel system estimating the depth according to the state of the art.

It knowingly comprises a detector, for example, a CCD detector associated with an optical subsystem, and a signal processing subsystem.

The optical subsystem is characterized by parameters noted $\theta o$, which typically correspond to:
- the focal length;
- the opening;
- the characteristics of the lenses constituting the optical system (number, radius of curvature, diameter, conicity, glass type); and
- the field.

The detector is characterized by the $\theta d$ parameters, which typically correspond to the size and the number of pixels, or to other characteristics such as exposure time, or, for example, the possible presence of a Bayer filter. The optics/detector assembly forms the image of the scene, which will be used for the estimation of depth.

The processing part of the electro-optical system uses the parameters of the point and scene spreading function, as well as processing parameters noted $\theta t$, which correspond, for instance, to the size of the thumbnails of the image.

The parameters of the source model, which are represented by $\theta x$, are involved in the depth estimation. The hypothesis on the source corresponds, for example, to a local model of the contrasts that the electro-optical system can observe (textures, contours, etc.).

Parameters Involved in the Precision of the Depth Estimation

The precision of the depth estimation first depends on the variability of the Point Spreading Function (PSF) with depth. The latter depends on the optical detectors $\theta o$ and $\theta d$ parameters. Then, the precision depends on the parameter $\theta t$, more particularly characterizing the number of pixels of each thumbnail used to estimate the depth.

In addition, some parameters affecting the depth estimation depend on the conditions of use of the electro-optical system. These are, on the one hand, the noise level, which affects the images, which is broadly linked to the lighting conditions wherein the device is used. This noise level is defined here by the Signal-to-Noise Ratio (SNR). On the other hand, characteristics of the scene observed by the device are described by the parameters of the source model, $\theta x$.

The precision of the depth estimation of an electro-optical system thus depends both on the optical and sensor parameters ($\theta d$ and $\theta c$), the processing parameters ($\theta t$) and on the conditions of use and the model of the source (SNR, $\theta x$).

Description of an Exemplary Method for Designing an Electro-Optical Single-Channel System Designing an electro-optical system estimating the depth requires the joint optimization of all the parameters that affect the accuracy of the estimation according to the user's requirements as regards the precision template and the conditions of use.

Let a user define, for example, the field of the electro-optical system, the SNR, the maximum overall dimensions of the electro-optical system and the desired precision over a depth range.

An exemplary designing method according to the proposed invention consists in:
- taking an initial electro-optical system for which the conditions of use are close to those imposed by the user in a library of electro-optical systems;
- modelling a set of PSFs relative to such system, either using simple mathematical functions, or using wave optics formulas or using optical design software;
- calculating the precision metric of the depth estimation;
- comparing the result with the template imposed by the user;
- executing a feedback loop introducing successive modifications in the optical, detector and processing parameters with a comparison of the metric with the template for each modification; and
- selecting the electro-optical system that is the closest to the template to return the optimized parameters to the user.

Advantageously, if several electro-optical systems meet the conditions imposed by the user, the latter can be offered several solutions or the possibility of imparting more constraints so as to re-optimize the system.

On the contrary, if the imparted conditions are too strict and do not make it possible to optimize an electro-optical system, the user will be informed thereof in order to revise his/her constraints.

The method described above is shown in FIG. 2.

Evaluation of the Estimation Precision

Advantageously, the precision metric of the depth estimation is calculated by a probabilistic average of the behavior of the discrepancy between the estimated distance and the actual distance in a catalog of images.

Conventionally, such discrepancy is characterized by calculating the average curvature of the likelihood function, as regards depth, for a catalog of images. Such likelihood function is calculated according to the following steps:
- recording a library of point spreading functions (PSFs), with each one of said PSF functions being associated with a depth and an electro-optical system;
- capturing at least one real image, or modelling at least one image using one of the PSFs in the PSF library;
- dividing the thumbnail image(s) into thumbnail(s) having a predetermined size to record a thumbnail collection;
- calculating the likelihood of each PSF, as regards the thumbnails' content and estimating, for each one of said thumbnails, the PSF that maximizes this likelihood; and measuring the local curvature of the likelihood criterion around the PSF that maximizes the likelihood function.

The measurement of this curve provides a value representative of the discrepancy between the estimated distance and the actual distance, referred to as the Cramer-Rao bound (CRB).

According to an advantageous alternative solution, the precision of the depth estimation is calculated without it being necessary to acquire or to simulate a catalog of images, thanks to the use of a spatial model of the source.

According to one particular alternative embodiment, the spatial model of the source is a power spectral density. Such modelling is particularly used in the patent EP1734746 mentioned in the state of the art.

According to one particular alternative embodiment, the source is modelled using the covariance matrix learned from an image database.

According to one particular alternative embodiment, the source is modelled using the precision matrix corresponding to the inverse of the covariance matrix, based on an assumption of isotropic and Gaussian function of the gradients of the source. Letting Qx be the precision matrix is an advantageous alternative solution and consists in writing:

$$\frac{D^T D}{\sigma_x^2} \quad (1)$$

where D is the concatenation of a horizontal and vertical first order derivative operator, and $\sigma_x^2$ is a parameter characterizing the variance of the gradients of the source.

According to a particular calculation, if Hp is the convolution matrix associated with the PSF of the depth p, modelling the source using the precision matrix makes it possible to write the CRB as follows:

$$BCR(p) = \left[ tr\left( Q_P^{-1} \frac{dQ_P}{dp} Q_P^{-1} \frac{dQ_P}{dp} \right) \right]^{-1} \quad (2)$$

The quantity characterizing the depth estimation precision is then $\sigma_{CRB}(p)$, which is the square root of CRB(p).

$$Q_P = R_b^{-1}(I - H_p(H_p^T R_b^{-1} H_p + Q_x)^{-1} H_p^T R_b^{-1}) \quad (3)$$

where Rb is the noise covariance matrix and Qp is the data precision matrix.

In one particular case, noise can be modelled as a random probability density white process and a Gaussian function with a variance $\sigma^2 b$ and the data precision matrix can then be written:

$$= \frac{I - B_P}{\sigma_b^2} \quad (4)$$

with $$B_P = H_P(H_P^T H_P + \alpha D^T D)^{-1} H_P^T \quad (5)$$

and $$\alpha = \frac{\sigma_b^2}{\sigma_x^2}, \quad (6)$$

which is interpreted as the reverse of the Signal-to-Noise Ratio (SNR).

Examples

1) Modifications in the Diaphragm to Help Estimate the Depth

The point-spreading functions of an ideal optical system (i.e., with no aberration), are simulated using wave optics formulas. Such system has a focal length of 50 mm and an opening of 2, with pixels of 7 µm. The focus plane is positioned at 1.9 m from the electro-optical system. The theoretical estimation precision obtained in the case of a conventional diaphragm is compared to the one obtained in the case of an encoded diaphragm, such as the one proposed in the article by A. Levin cited in the state of the art, for the same signal-to-noise ratio.

Figure 3:
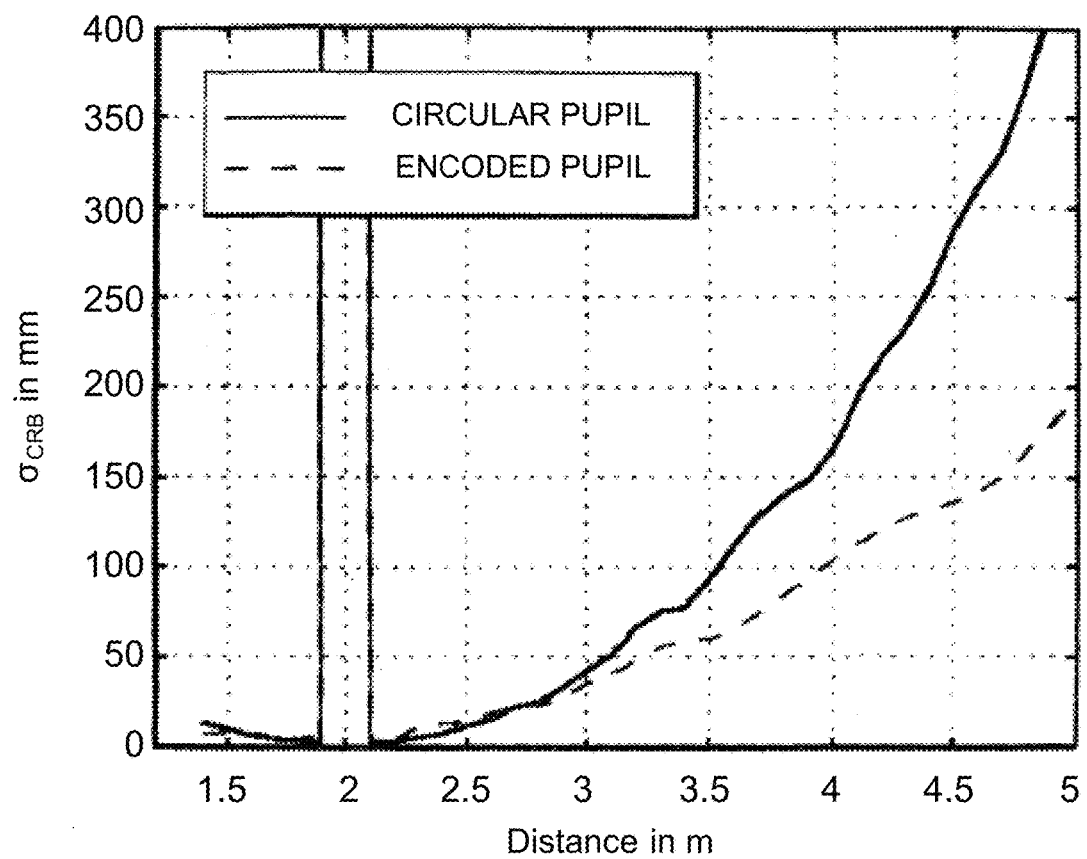
FIG. 3 shows the curve of the theoretical estimation accuracy obtained when using a calculation of depth estimation performance for two optical systems having the same focal length and the same opening but different diaphragm shapes.

FIG. 3 illustrates the gain of the encoded diaphragm with respect to a conventional diaphragm for the depth estimation.

Such curves make it possible to compare various forms of diaphragm to find the one that facilitates the depth estimation.

2) Modification in the Focus to Help the Depth Estimation

The point spreading functions of an ideal electro-optical system, i.e., which is free of aberrations, are simulated using wave optics formulas. Such system has a focal length of 20 mm and an opening of 3, with pixels of 7 µm.

The focus plane is positioned 1.4 m (green curve) and 2 m (blue curve) away from the device. The theoretical estimation precision of σCRB obtained for the two focuses is compared.

Figure 4:
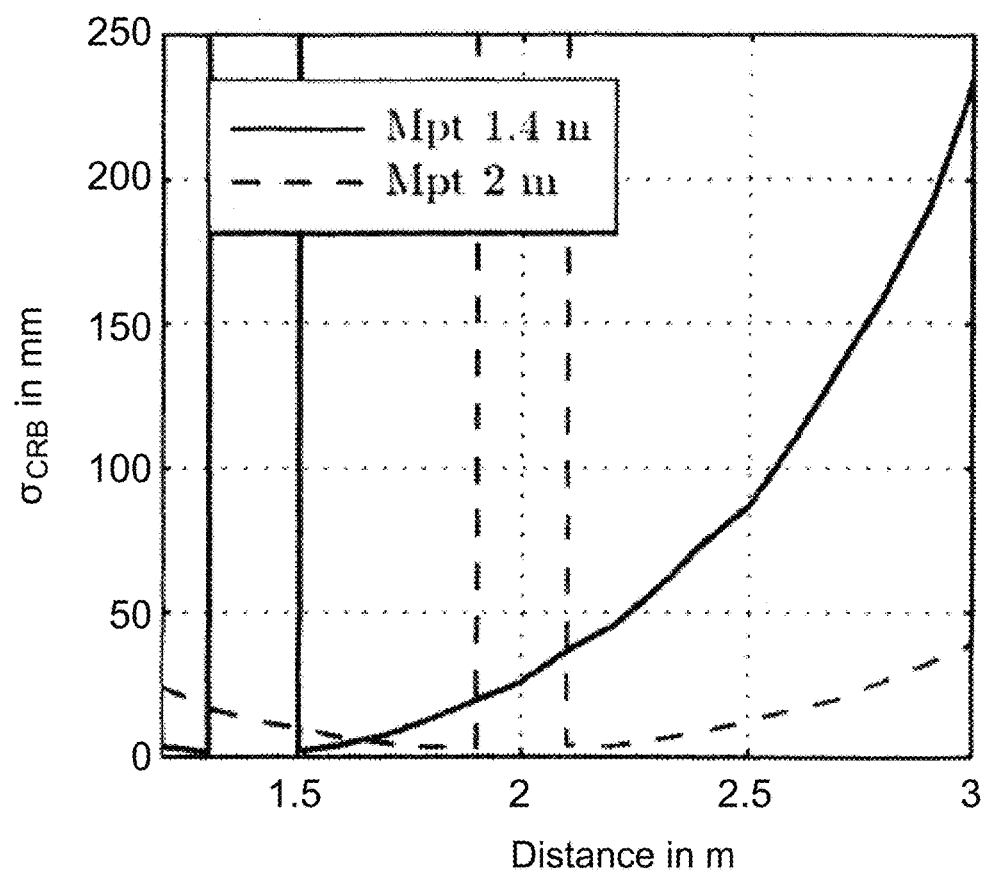
FIG. 4 shows the curve of the theoretical estimation accuracy obtained when using a calculation of depth estimation performance for two different focuses in the same optical system.

FIG. 4 shows that two different focuses do not have the same estimation precision curves.

Each one more particularly has a peak of inaccuracy as regards the focus plane. Thus, to estimate a depth between 0.5 and 1 m, a 1.3 m focus should rather be used. Similarly, to estimate distances beyond 2.5 m, the 2m focus is more favorable. Such curves make it possible to adjust the focus of the device according to the region of space wherein depth is to be estimated.

Figure 5:
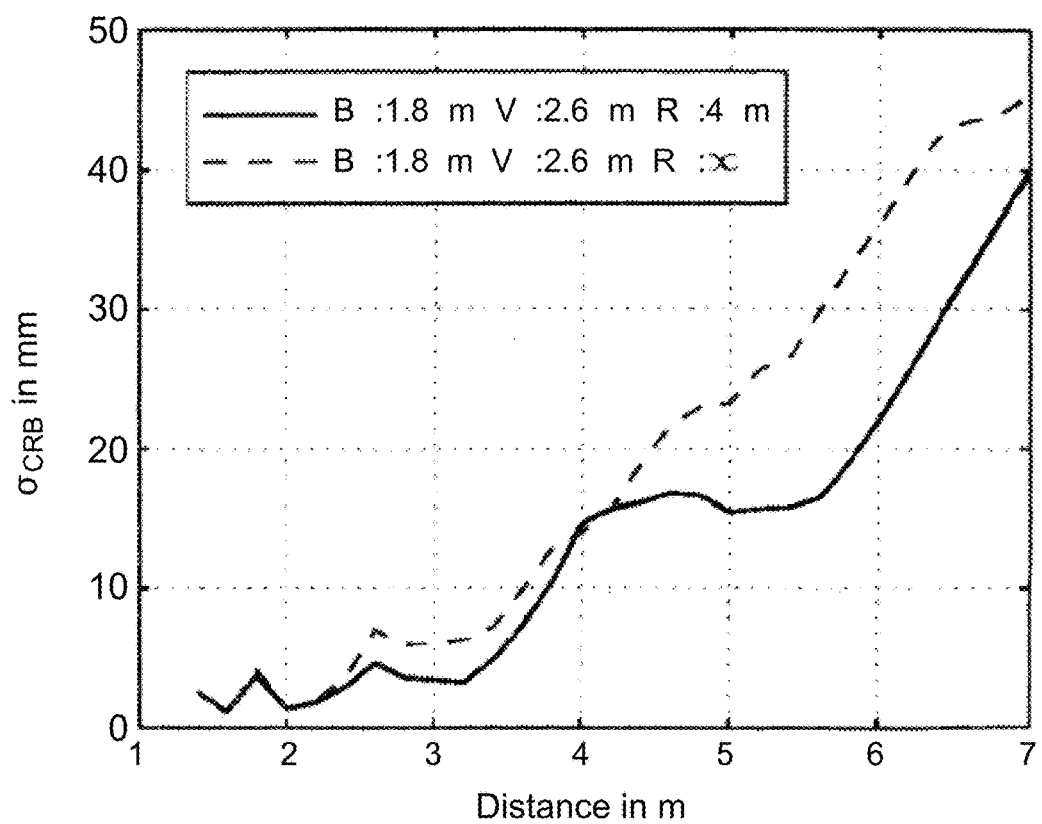
FIG. 5 shows the curve of theoretical estimation accuracy obtained when using a calculation of depth estimation performance for two chromatic optical systems having different positions of the focus planes of the red, green and blue channels.

3) Modifications in the Position of the Focus Planes of the Three Red, Blue, and Green Channels in the Case of Chromatic Optics FIG. 5 shows the theoretical depth estimation performances of two electro-optical chromatic systems having an opening of 3, a focal length of 25 mm, having a detector of the tri-CCD type, with pixels of 5 µm. The focus and the axial chromatic aberration of both systems are set so as to have the focus planes of the green and blue channels at 1.8 m and 2.6 m, respectively, for both systems. The focus plane of the red channel is 4 m away for the first system and is ad infinitum for the second system. The σCRB curves show that the most favorable system in the 1 to 5 m region is the system with a 4 m focus of the red channel.

4) Optimization of a Chromatic Electro-Optical System

Figure 2:
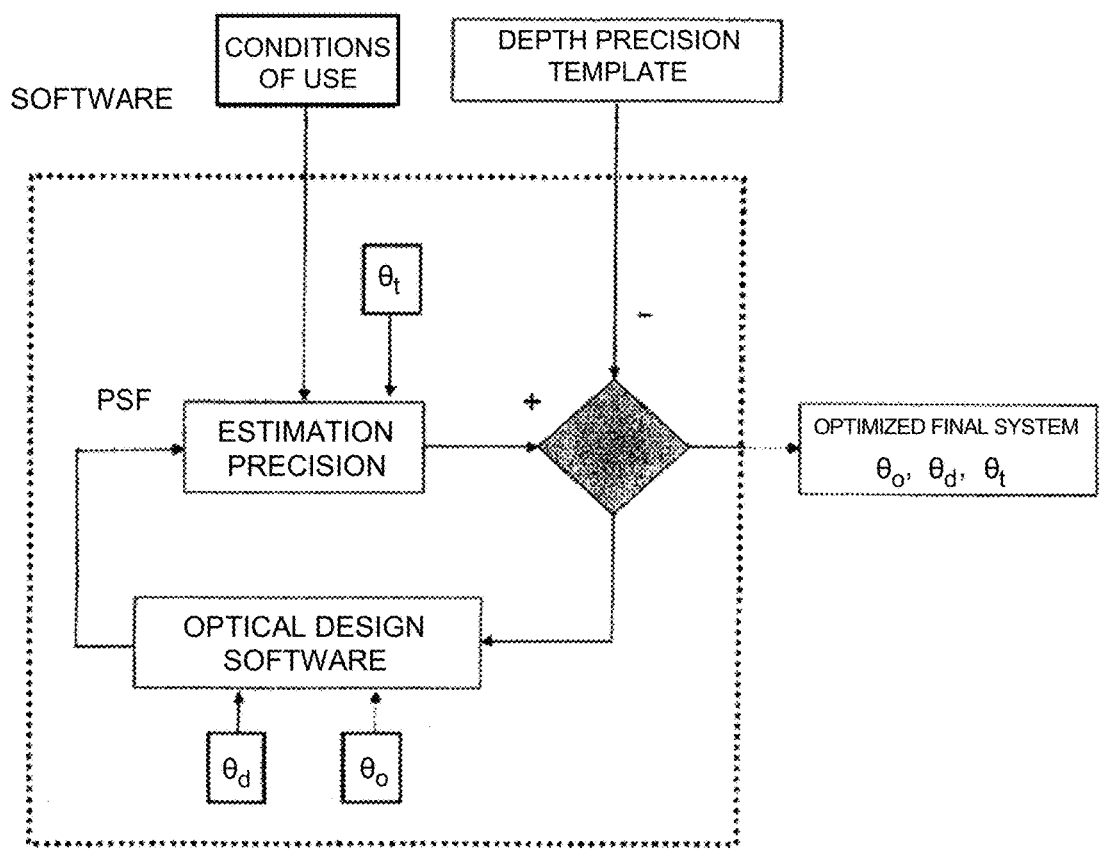
FIG. 2 shows the schematic diagram of the design-assisted method provided.
Figure 6:
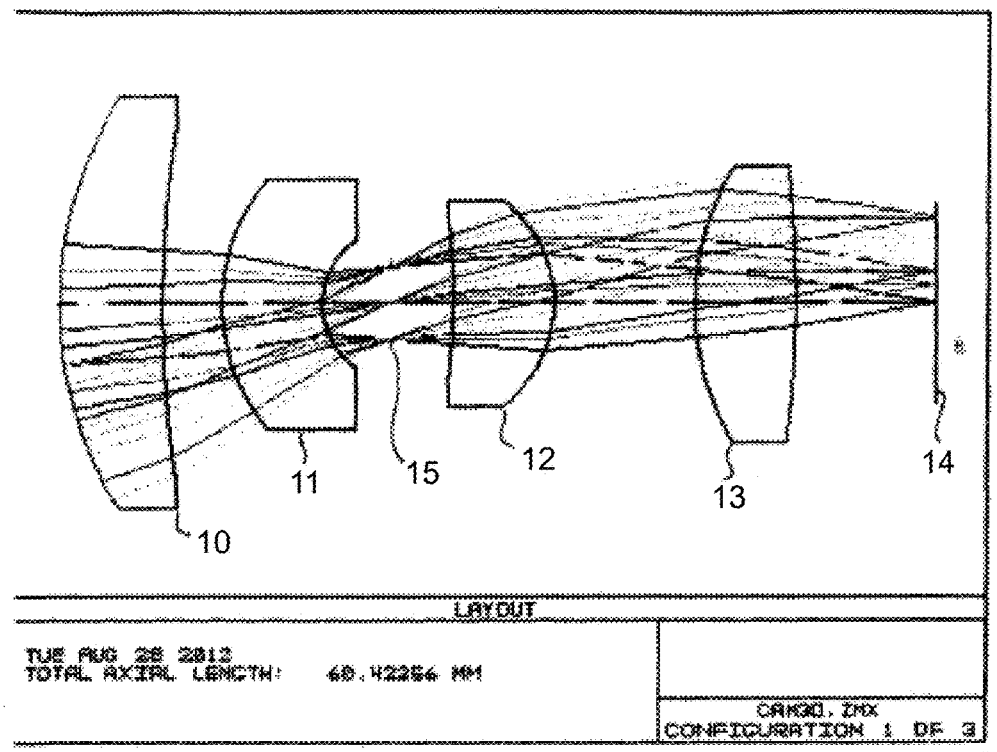
FIG. 6 shows the lenses constituting an electro-optical system optimized to facilitate the estimation of depth.
Figure 8:
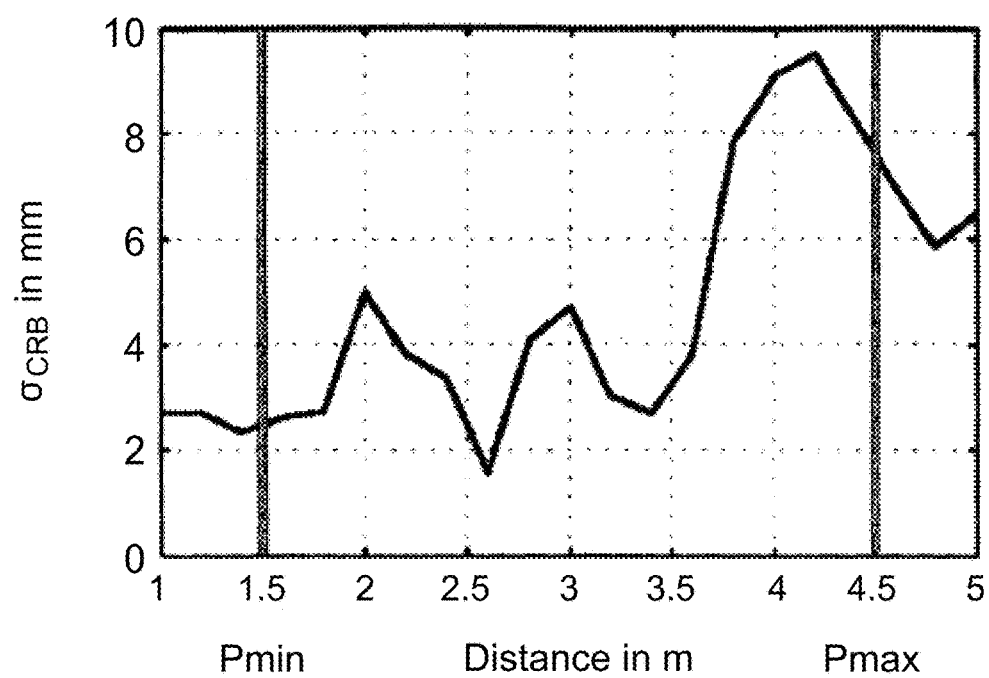
FIG. 8 shows the curve of the theoretical estimation accuracy obtained when using a calculation of depth estimation performance for the electro-optical system shown in FIGS. 6 and 7.

FIGS. 6 and 7 show the characteristics of an optimized chromatic electro-optical system using the method illustrated in FIG. 2. FIG. 8 shows the σCRB curves of such imager over a depth range.

Detailed Description of the Electro-Optical Device

The present example relates to an exemplary optical device comprising means for estimating the depth.

The device illustrated in FIG. 6 comprises an objective formed, in the example described by way of non-restrictive example, of four lenses 10 to 13 and a detector 14 positioned in the focal plane of the objective.

The lens 13 is of the conical type to correct certain optical aberrations.

A diaphragm 15 is positioned in the optical path of the objective. In the example described, this diaphragm is of a conventional type, but it may also be formed by an encoded diaphragm.

The invention relates to the optimization of this known objective to maximize the precision of the depth estimation, within a determined range [$P_{min}$, $P_{max}$] shown in FIG. 8.

Such optimization may be executed either experimentally and empirically or by simulation.

The empirical method consists in generating a plurality of objectives, with lenses having different index, positioning and curvatures characteristics, with the following constraints:
- constant number N of lens;
- constant focal length of the objective for a reference wavelength;
- constant opening of the objective lens;
- unchanged detector; and
- the signal-to-noise ratio of the observed light source.

The variable parameters are:
- the radius of curvature of each one of the N lenses;
- the nature of the material (and hence index) of each one of the N lenses;
- the relative position of each one of the N lenses;
- the conicity of the conical lens 12 when such lenses are provided;
- the position of the detector 14; and
- the position and the configuration of the diaphragm 15.

For each one of the optical systems, a point light source having a wide spectral band is positioned at a distance p between $P_{min}$ and $P_{max}$, preferably on the optical axis, and at least one chromatic image produced with the M-channel detector 14 is acquired, with such image being referred to as $PSF_m(p)$ for m=1, ..., M. For example, the detector comprises three "RGB" channels. In the described example, M is equal to three and m=R, G, B is acquired for a chromatic image triplet $PSF_m(p)$. Each image in the triplet makes it possible to calculate a convolution matrix $H_m$ Using the M matrices $H_m$, a chromatic matrix $H_p$ is then obtained with the following equation:

$$H_P(p) = \begin{pmatrix} c_{1,1}H_R & c_{1,2}H_R & c_{1,3}H_R \\ c_{2,1}H_G & c_{2,2}H_G & c_{2,3}H_G \\ c_{3,1}H_B & c_{3,2}H_B & c_{3,3}H_B \end{pmatrix}$$

where $c_{i,j}$ are the following coefficients:

$$C = \begin{pmatrix} \frac{1}{\sqrt{3}} & \frac{-1}{\sqrt{2}} & \frac{-1}{\sqrt{6}} \\ \frac{1}{\sqrt{3}} & \frac{1}{\sqrt{2}} & \frac{-1}{\sqrt{6}} \\ \frac{1}{\sqrt{3}} & 0 & \frac{2}{\sqrt{6}} \end{pmatrix}$$

Such matrix $H_p(p)$ is then used to calculate a precision matrix $Q_p$ as described in the equation (3).

The matrix $Q_X$ is defined by:

$$Q_x = \begin{pmatrix} \mu D^T D & 0 & 0 \\ 0 & D^T D & 0 \\ 0 & 0 & D^T D \end{pmatrix}$$

with $$\mu = 0.05.$$

where D is the concatenation of the horizontal and vertical first order derivative operators.

Then an additional triplet of chromatic images corresponding to the same light source positioned at a distance $\rho+\Delta\rho$ is acquired. A precision matrix $Q_p(p+\Delta p)$ is obtained using the same method.

From such matrices, a digital approximation of the equation (2) is determined with the equation:

$$\frac{dQ_P}{dp}(p) \approx \frac{Q_P(p+\Delta p) - Q_P(p)}{\Delta p}$$

Such CRB describes the system analyzed for the source position p.

Such calculation is repeated on a plurality of depths p, to determine, for each one of the assemblies, a curve of the σCRB(p) values as a function of the distance p from the source, two examples of which are shown in FIG. 5.

The digital approximation of the CRB in the position p can advantageously be calculated from a number of measures S>2 around the position p: $\rho+\Delta\rho_s$, for s=1, ..., S.

The optimal system is determined by selecting the one having the best σCRB curve. Such criterion can be determined according to the minimization of the average of the curve points, or the curve integrant, or more generally, any quality function deduced from the collection of the σCRB values.

FIG. 8 shows an exemplary selected curve and related values for the determination of the optical assembly shown in FIG. 7.

Alternatively, this process can be virtually implemented from optical simulation software of the ZEMAX® type.

To optimize the axial chromatic aberration, the combination of two lenses having different indexes or the combination of a refractive lens and a diffractive lens can be selected. In order not to be limited by the diffraction efficiency of the diffractive lens over a wide spectral band, the combination of two optics having different constringencies is preferred.

In order to subsequently correct the lateral chromatic aberration and the distortion, it is necessary to check that the point position of the image is the same in the XY plane of the detector for each wavelength and that the barycenters of the image spots for each wavelength for a point of the field are in the same position on the detector.

It is, therefore, necessary to distribute the lenses on both sides of the diaphragm.

The optical system meets the constraint of the telecentric feature (the average angle of the field radiuses at the outlet of the pupil and comes perpendicularly onto the detector). This property ensures that the barycenters of the image spots for each wavelength for a point in the field will be in the same position on the detector in the case of defocusing. Such constraint will be taken into account by the lens closest to the detector.

The system preferably has a large opening (in the example, the system is open to F/3) so as to reduce the depth of field and accentuate the blur variations. A large opening requires a larger correction of the aberrations. To limit the number of aspheric surfaces for reasons of tolerancing, lenses are added into the optical architecture. To limit the opening of the lens positioned on either side of the diaphragm and thus reduce the amplitude of the aberrations, a duplication of each one of these lenses is provided. Another solution consists in adding a lens at the diaphragm so as to efficiently correct the spherical aberration. The system then has a three lens architecture called Cooke triplet. Such solution, however, provides no access to the diaphragm (for positioning an encoded diaphragm, for example).

The preferred architecture consists of four lenses positioned on either side of the diaphragm. This architecture is a variant of the Rapid rectilinear (page 278 of the book: Handbook of Optical Systems, Volume 4) or double Gauss (page 303 of the book: Handbook of Optical Systems, Volume 4). The differences result from the absence of doublets and the constraint of telecentric features (with the fourth lens, which is closest to the detector, being spaced from the third lens to ensure the telecentric feature and the correction of the field curvature).

The optimization using optical calculation software such as ZEMAX® makes it possible to select the radii of curvature, the thickness and the position of each lens. The materials of each lens are so selected as to produce the correct amount of axial chromatic aberration. Conicity is added to one of the surfaces in order to correct residual aberrations.

The invention claimed is:

1. A computer-implemented method for designing an electro-optical imaging system for estimating a distance between a point of arrival of the electro-optical imaging system and a source, the electro-optical imaging system including an optical subsystem, a detector subsystem and a digital image processing subsystem, the method comprising:
   modeling propagation of radiation from the source through the optical subsystem, the detector subsystem, and the digital image processing subsystem, the modeling based, at least in part, on a spatial model of the source;
   simultaneously determining design parameters for the optical subsystem and the digital image processing subsystem based, at least in part, on a performance metric, wherein said performance metric is determined using a comparison function that compares an estimate of the distance between the point of arrival and the source and the actual distance between the point of arrival and the source; and
   providing an electro-optical imaging system including the optical subsystem, the detector subsystem, and the digital image processing subsystem conforming to the determined design parameters for the optical subsystem and the digital image processing subsystem;
   wherein said comparison function comprises calculating a probabilistic average of the behavior of the discrepancy between the estimated distance and the actual distance for a catalog of images; and
   wherein said discrepancy is characterized by calculating an average curvature of a likelihood function, as regards the depth, for the catalog of images, such likelihood function being calculated according to the following acts:
      recording a library of point-spreading functions (PSFs), with each one of said PSF functions being associated with a depth and with one of a plurality of different electro-optical systems;
      at least one of capturing and modeling at least one image using one of the PSFs of the PSF library;
      dividing said at least one image into at least one thumbnail having a preset size to record a thumbnail collection;
      calculating a likelihood of each PSF, as regards the content of the thumbnails, and estimating the point-spreading function (PSF), which maximizes this likelihood for each one of said thumbnails; and
      measuring a local curvature of the likelihood function around the PSF to maximize the likelihood function.

2. The method according to claim 1, wherein said likelihood function is calculated from the spatial model of the source.

3. The method according to claim 2, wherein said model is at least one of:
   a power spectral density;
   a covariance matrix learned from an image database, and;
   a precision matrix, based on an isotropic and Gaussian distribution of source gradients.

4. The method according to claim 1, further comprising simultaneously acquiring and processing a plurality of images with different focuses.

5. The method according to claim 4, wherein said plurality of images is obtained with a detector consisting of a plurality of arrays of sensors, with each array of the plurality of arrays of sensors being sensitive to a specific spectral band, and with each image of the plurality of images corresponding to one of said spectral bands.

6. The method according to claim 5, further comprising adjusting a focus for each one of said spectral bands with the optical subsystem.

7. The method according to claim 1, further comprising varying an encoding of an encoded diaphragm, and determining a resulting discrepancy resulting therefrom.

8. The method according to claim 1, further comprising optimizing the determined parameters for the optical subsystem and the digital image processing subsystem in real time to facilitate estimation of the distance between the point of arrival and the source with conditions of use, the conditions at least one of provided by a user, and estimated by algorithms corresponding to the electro-optical system.

9. The method according to claim 1, wherein determining design parameters comprises combining the performance metric with another metric characterizing an ability to produce an image having a large depth of field.

10. The method according to claim 1, wherein the performance metric is compared to a template set by a user.

11. The method according to claim 10, wherein if several hypothetical electro-optical systems match the template, the several hypothetical electro-optical systems are proposed to the user, and options to impose more constraints are provided to the user.

12. The method according to claim 10, further comprising informing the user if no hypothetical electro-optical system matches the template, and prompting the user to reduce the constraints.

13. An electro-optical device comprising:
    a depth estimator operating in a distance range;
    an objective comprising a number of lenses;
    a detector positioned in a focal plane of the objective; and
    a diaphragm;
    wherein characteristics of said objective are determined according to a performance metric depending on a comparison function that performs a comparison between a local estimate of a distance from a source to a point of arrival of the electro-optical device and an actual distance from the source to the point of arrival;

wherein said comparison function comprises calculating a probabilistic average of the behavior of the discrepancy between the estimated distance and the actual distance for a catalog of images; and wherein said discrepancy is characterized by calculating an average curvature of a likelihood function, as regards the depth, for the catalog of images, such likelihood function being calculated according to the following acts:

recording a library of point-spreading functions (PSFs), with each one of said PSF functions being associated with a depth and with one of a plurality of different electro-optical systems;

at least one of capturing and modeling at least one image using one of the PSFs of the PSF library;

dividing said at least one image into at least one thumbnail having a preset size to record a thumbnail collection;

calculating a likelihood of each PSF, as regards the content of the thumbnails, and estimating the point-spreading function (PSF), which maximizes this likelihood for each one of said thumbnails; and measuring a local curvature of the likelihood function around the PSF to maximize the likelihood function.

14. An electro-optical device according to claim 13, wherein at least one lens of said number of lenses is of conical type.

15. A method of manufacturing an electro-optical device, the method comprising:

modeling, with a computer, propagation of radiation from a source through a plurality of different hypothetical optical subsystems for the electro-optical device using a spatial model of the source, wherein each hypothetical optical subsystem of the plurality of different hypothetical optical subsystems is associated with a different set of optical parameters;

modeling detection of the radiation for a hypothetical detector subsystem of the electro-optical device for each hypothetical optical subsystem of the plurality of different hypothetical optical subsystems;

modeling, for each hypothetical optical subsystem, image processing of data corresponding to the radiation detected by the detector subsystem for a plurality of different hypothetical image processing subsystems for the electro-optical device, wherein each hypothetical image processing subsystem is associated with a different set of processing parameters;

computing a performance metric of the electro-optical device for each combination of the plurality of different hypothetical optical subsystems and the plurality of different hypothetical image processing subsystems, wherein the performance matrix is determined using a comparison function that compares an actual distance between a point of arrival of the electro-optical device and the source to an estimate of the actual distance, wherein said comparison function comprises calculating a probabilistic average of the behavior of the discrepancy between the estimated distance and the actual distance for a catalog of images, said discrepancy being characterized by calculating an average curvature of a likelihood function, as regards the depth, for the catalog of images, such likelihood function being calculated according to the following acts:

recording a library of point-spreading functions (PSFs), with each one of said PSF functions being associated with a depth and with one of a plurality of different electro-optical systems;

at least one of capturing and modeling at least one image using one of the PSFs of the PSF library;

dividing said at least one image into at least one thumbnail having a preset size to record a thumbnail collection;

calculating a likelihood of each PSF, as regards the content of the thumbnails, and estimating the point-spreading function (PSF), which maximizes this likelihood for each one of said thumbnails; and measuring a local curvature of the likelihood function around the PSF to maximize the likelihood function;

selecting a combination of one of the plurality of different hypothetical optical subsystems and one of the plurality of different hypothetical image processing subsystems based, at least in part, on the performance metric corresponding thereto; and manufacturing the electro-optical device including:

an optical subsystem having a same set of optical parameters as the selected one of the plurality of different hypothetical optical subsystems; and an image processing subsystem having a same set of processing parameters as the selected one of the plurality of different hypothetical image processing subsystems.

16. The method of claim 15, wherein the set of optical parameters comprises at least one of a focal length of lenses of the optical subsystem, a number of lenses of the optical subsystem, radii of curvature of the lenses, diameter of the lenses, conicity of the lenses, and materials of the lenses.

17. The method of claim 15, wherein the set of processing parameters includes at least one of point spreading function parameters, and a size of image thumbnails.

18. The method of claim 15, wherein the comparison function comparing the actual distance to the estimated distance compares a distance between a center point of an entrance pupil of the optical subsystem and the source to an estimate of the distance between the center point of the entrance pupil and the source.

* * * * *